(12) United States Patent
Chen et al.

(10) Patent No.: US 9,788,428 B2
(45) Date of Patent: Oct. 10, 2017

(54) STACK STRUCTURE OF CIRCUIT BOARD

(71) Applicant: Innodisk Corporation, New Taipei (TW)

(72) Inventors: Chih-Hsing Chen, New Taipei (TW); Hsiao-Yu Wang, New Taipei (TW)

(73) Assignee: INNODISK CORPORATION, New Taipei (TW)

( * ) Notice: Subject to any disclaimer, the term of this patent is extended or adjusted under 35 U.S.C. 154(b) by 68 days.

(21) Appl. No.: 15/135,248

(22) Filed: Apr. 21, 2016

(65) Prior Publication Data

US 2016/0353573 A1 Dec. 1, 2016

(30) Foreign Application Priority Data

Jun. 1, 2015 (TW) .............................. 104117747 A

(51) Int. Cl.
*H05K 1/11* (2006.01)
*H05K 1/14* (2006.01)
*H05K 3/36* (2006.01)

(52) U.S. Cl.
CPC ............. *H05K 1/144* (2013.01); *H05K 3/368* (2013.01); *H05K 2201/042* (2013.01); *H05K 2201/09063* (2013.01); *H05K 2201/10189* (2013.01); *H05K 2201/10409* (2013.01)

(58) Field of Classification Search
CPC ............. H05K 1/144; H05K 2201/042; H05K 2201/09063; H05K 2201/10189; H05K 2201/10409; H05K 3/368
See application file for complete search history.

(56) References Cited

U.S. PATENT DOCUMENTS

| | | | | |
|---|---|---|---|---|
| 6,014,313 A * | 1/2000 | Hesselbom | ......... | H01L 25/0652 174/16.3 |
| 8,106,505 B2 * | 1/2012 | Bernstein | .............. | H01L 23/473 257/712 |
| 9,173,304 B2 * | 10/2015 | French, Jr. | ............. | H05K 3/368 |
| 9,674,940 B2 * | 6/2017 | Lee | ...................... | H05K 1/0206 |
| 9,713,293 B2 * | 7/2017 | Takeuchi | ........... | H05K 7/20927 |
| 2014/0198470 A1 * | 7/2014 | Shi | ......................... | H05K 1/144 361/803 |
| 2014/0206207 A1 * | 7/2014 | Ming | ................... | H05K 1/0213 439/78 |
| 2017/0161223 A1 * | 6/2017 | Song | ....................... | G06F 1/185 |

* cited by examiner

*Primary Examiner* — Yuriy Semenenko
(74) *Attorney, Agent, or Firm* — Chun-Ming Shih

(57) ABSTRACT

The invention provides a stacked structure comprising a master circuit board and at least two slave circuit boards. The master circuit board comprises a plurality of connecting seats. Each slave circuit board is equipped with a connector, and defined with a plurality of post-production process areas. Wherein the connector of each slave circuit board is disposed on one of post-production process areas, and inserted into the corresponding connecting seat. When the connector of the slave circuit board must be through other slave circuit boards in order to insert the corresponding connecting seat, the post-production process areas that are disposed on other slave circuit boards and impede the connection between the connector and the corresponding connecting seat will be cut into hollow areas. Accordingly, the connector of the slave circuit board is capable of inserting the corresponding connecting seat through the hollow areas of other slave circuit boards.

8 Claims, 9 Drawing Sheets

STACK STRUCTURE OF CIRCUIT BOARD

CROSS-REFERENCE TO RELATED APPLICATIONS

This non-provisional application claims priority claim under 35 U.S.C. §119(a) on Taiwan Patent Application No. 104117747 filed Jun. 1, 2015, the entire contents of which are incorporated herein by reference.

FIELD OF THE INVENTION

The present invention relates to a stack structure of circuit board, particularly to a structure of multiple slave circuit boards stacked on a master circuit board.

BACKGROUND

In order to conform the function requirement of computer equipment, an expansion board is often added into a master circuit board, such as motherboard, inside the computer equipment. FIG. 1 is a stereoscopic construction diagram of an expansion board being added into a master circuit board according to the prior art. As shown in FIG. 1, the computer equipment comprises a master circuit board 51. The master circuit board 51 is provided thereon with a plurality of connecting seats 511 conforming to specific transfer specification, such as the connecting seat conforming to PCIe transfer specification. When the computer equipment desires to expand the function, a connector 521 of an expansion board 52 will be inserted into the connecting seat 511 of the master circuit board 51 so as to expand the function of the computer equipment.

In the past, the connector 521 is often disposed on an underside edge of the expansion board 52. Therefore, the expansion board 52 will be perpendicular to the master circuit board 51 when the connector 521 of the expansion board 52 is inserted into the connecting seat 511. Accordingly, the computer equipment must be provided with a space capable of accommodating the expansion board 52 inserted into the master circuit board 51 in a perpendicular direction, in such the way that will be a barrier for the current computer equipment desirous of light, thin, short and small characteristics.

As shown in FIG. 2, otherwise, the connector 541 is selectively disposed on a horizontal surface of the expansion board 54. Therefore, the expansion board 54 will be stacked on the master circuit board 53 to form a spliced appearance when the connector 541 of the expansion board 54 is inserted into the connecting seat 531 of the master circuit board 53. Although the volume that is constituted based on the expansion board 54 inserting into the master circuit board 53 by adopting the spliced way is able to decrease, the master circuit board 53 only allows single expansion board 54 to insert therein, resulting in the expansion of function of the master circuit board 53 will be limited.

SUMMARY

It is one object of the present invention to provide a stack structure of circuit board. The stack structure comprises a master circuit board and a plurality of slave circuit boards used for expanding functions. The master circuit board is not only allowed the slave circuit boards to insert therein by adopting a spliced way, so as to decrease the volume of the stack structure, but also the master circuit board is able to simultaneous splice with multiple slave circuit boards, so as to increase the convenience and flexibility of expansion of functions of the master circuit board.

It is another object of the present invention to provide a stack structure of circuit board, in which the master circuit board comprises a plurality of connecting seats, and each of slave circuit boards is equipped with a connector and defined with a plurality of post-production process areas. Wherein the connector of each slave circuit board is disposed on one of the post-production process areas based on a location of the corresponding connecting seat of the master circuit board. When the connector of the slave circuit board must be through the other slave circuit boards in order to insert the corresponding connecting seat of the master circuit board, the post-production process areas, which are disposed on other slave circuit boards and impede a connection between the connector of the slave circuit board and the corresponding connecting seat of the master circuit board, will be cut to fabricate into hollow areas, so that the connector of the slave circuit board is capable of inserting the corresponding connecting seat of the master circuit board through the hollow areas of the other slave circuit boards. In such the way that the master circuit board may splice with multiple slave circuit boards, simultaneously.

For achieving the above objects, the present invention provides a stack structure of circuit board, comprising: a master circuit board comprising a plurality of connecting seats; at least two slave circuit boards, each of the slave circuit boards being equipped with a connector, and defined with a plurality of post-production process areas, wherein the stack structure is consisted of the master circuit board and the slave circuit boards, wherein the connector of each of the slave circuit boards is disposed on one of the post-production process areas based on a location of the corresponding connecting seat of the master circuit board, and inserted into the corresponding connecting seat of the master circuit board, respectively; wherein when the connector of one of the slave circuit boards must be through the other slave circuit boards in order to insert the corresponding connecting seat of the master circuit board, the post-production process areas, which are disposed on the other slave circuit boards and impede a connection between the connector of one of the slave circuit boards and the corresponding connecting seat of the master circuit board, will be fabricated into hollow areas, so that the connector of one of the slave circuit boards is capable of inserting the corresponding connecting seat of the master circuit board through the hollow areas of the other slave circuit boards.

In one embodiment of the present invention, wherein the connector disposed on one of the post-production process areas of each of the slave circuit boards is electrically connected to an application circuit via circuit layouts arranged on the slave circuit board.

In one embodiment of the present invention, wherein at least one conductive element is disposed on the post-production process area without being cut, as well as without disposing the connector.

In one embodiment of the present invention, wherein the connector of each of the slave circuit boards is electrically connected to the application circuit via the conductive element and the circuit layouts arranged on the slave circuit board.

In one embodiment of the present invention, wherein the conductive element is a bond pad, a metal bump, or an electronic element.

In one embodiment of the present invention, wherein the number of the connectors of the master circuit board is more than or equal to the number of the slave circuit boards, as well as the number of the post-production process areas defined on each of the slave circuit boards.

In one embodiment of the present invention, wherein the slave circuit boards are fabricated by adopting the same dimensions and specifications of circuit boards.

In one embodiment of the present invention, further comprising at least one fixed column and at least one fixed element, wherein the master circuit board and the slave circuit boards are further provided with at least one hole, respectively, the fixed member is combined with the corresponding fixed column through the holes of the master circuit board and the slave circuit boards.

DETAILED DESCRIPTION OF THE PREFERRED EMBODIMENTS

Figure 1:
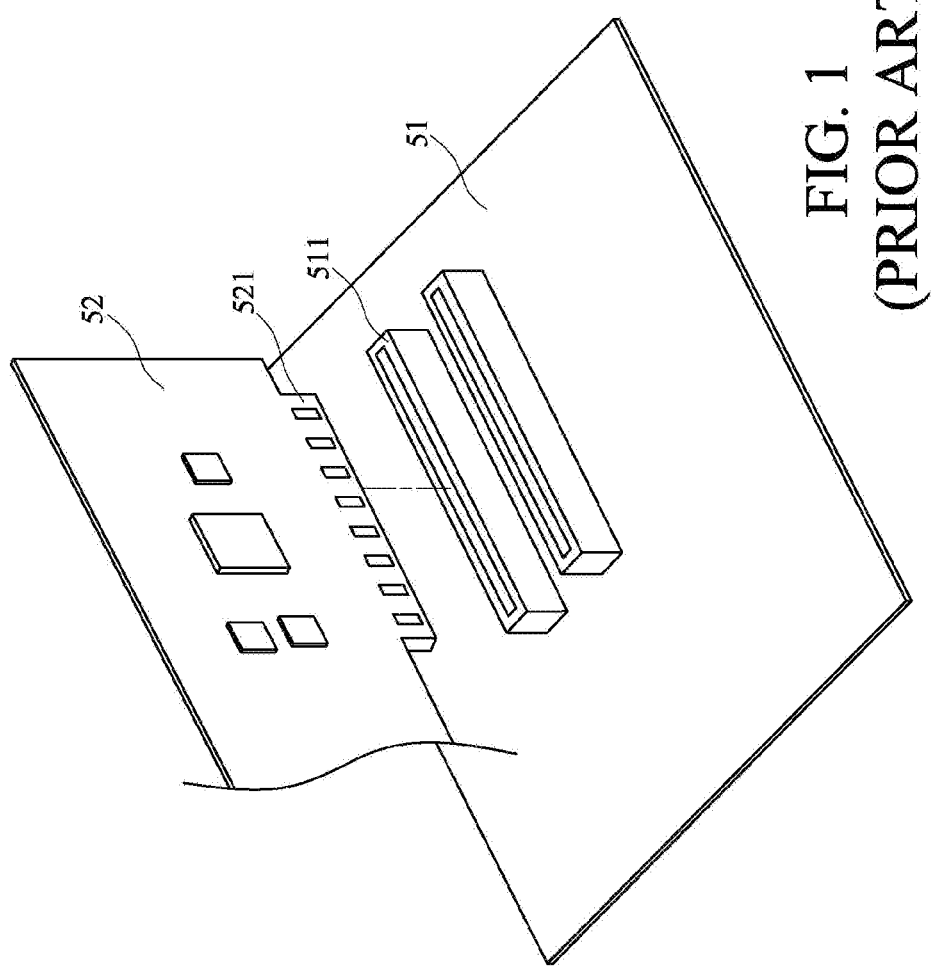
FIG. 1 is a stereoscopic construction diagram of an expansion board being added into a master circuit board according to the prior art.
Figure 2:
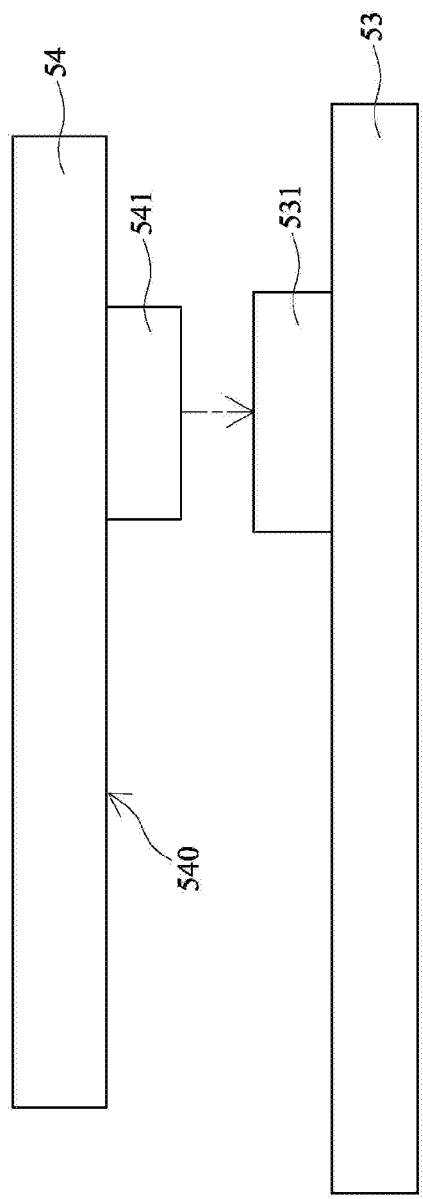
FIG. 2 is another stereoscopic construction diagram of an expansion board being added into a master circuit board according to the prior art.
Figure 3:
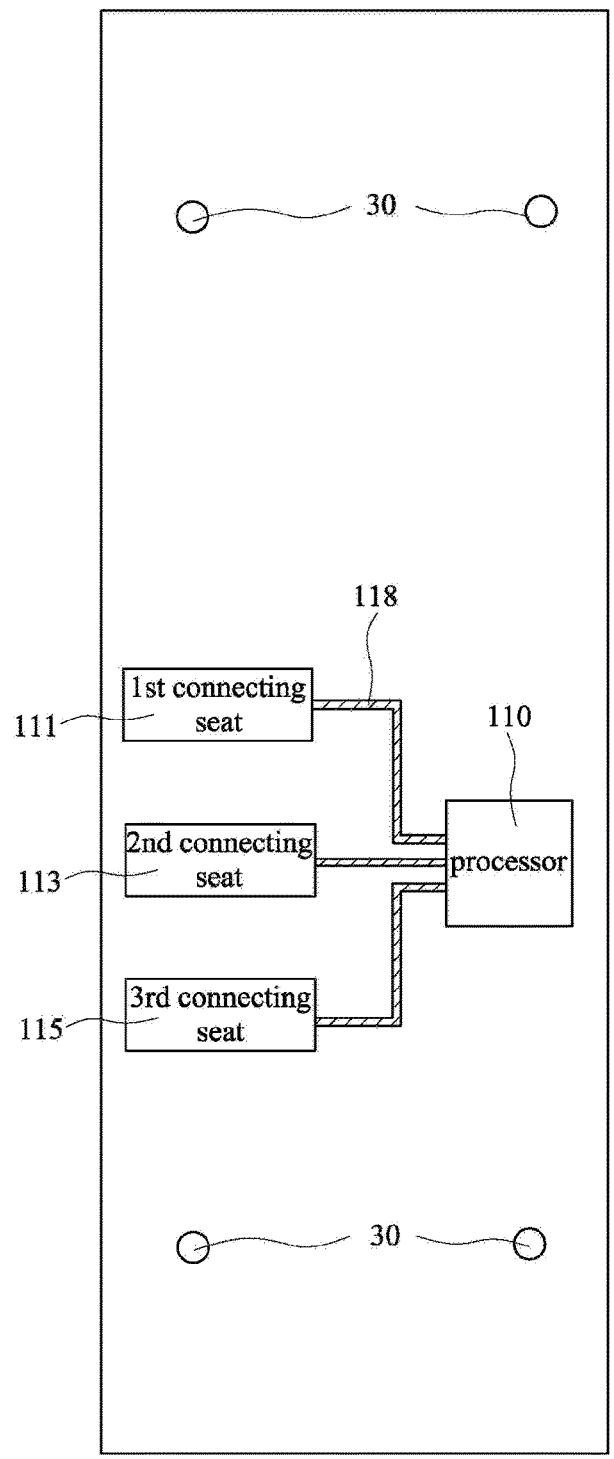
FIG. 3 is a planar diagram of a master circuit board of the present invention.

Referring to FIG. 3, there is a planar diagram of a master circuit board of the present invention. As shown in FIG. 3, the master circuit board 11 of the present invention comprises a processor 110 and a plurality of connecting seats, such as a first connecting seat 111, a second connecting seat 113, and a third connecting seat 115. The processor 110 is electrically connected to the first connecting seat 111, the second connecting seat 113, and the third connecting seat 115 via circuit layouts 118. In the present invention, the master circuit board 11 is a motherboard of computer equipment.

Figure 4:
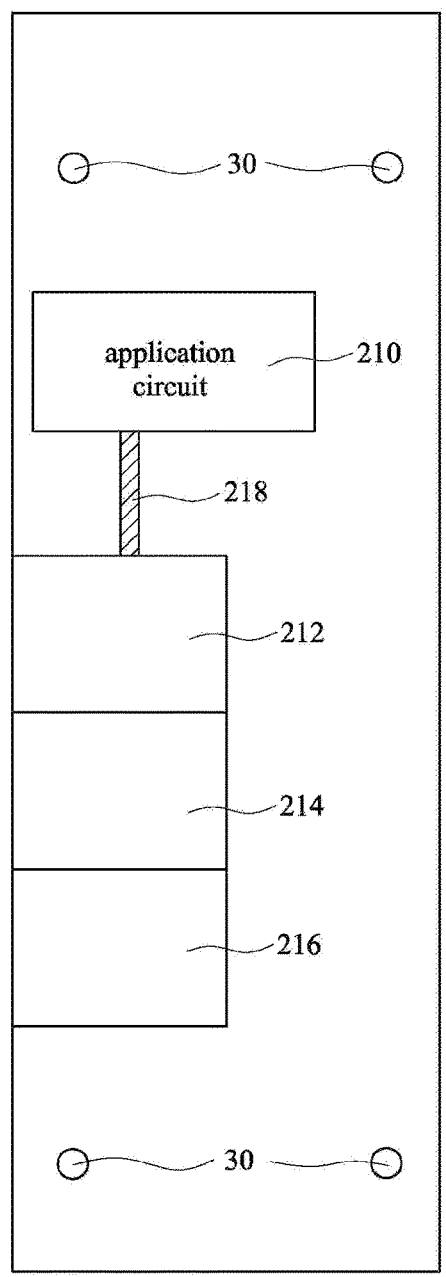
FIG. 4(A) and FIG. 4(B) are planar diagrams of a first slave circuit board before post-production process and after post-production process of the present invention.
Figure 4:
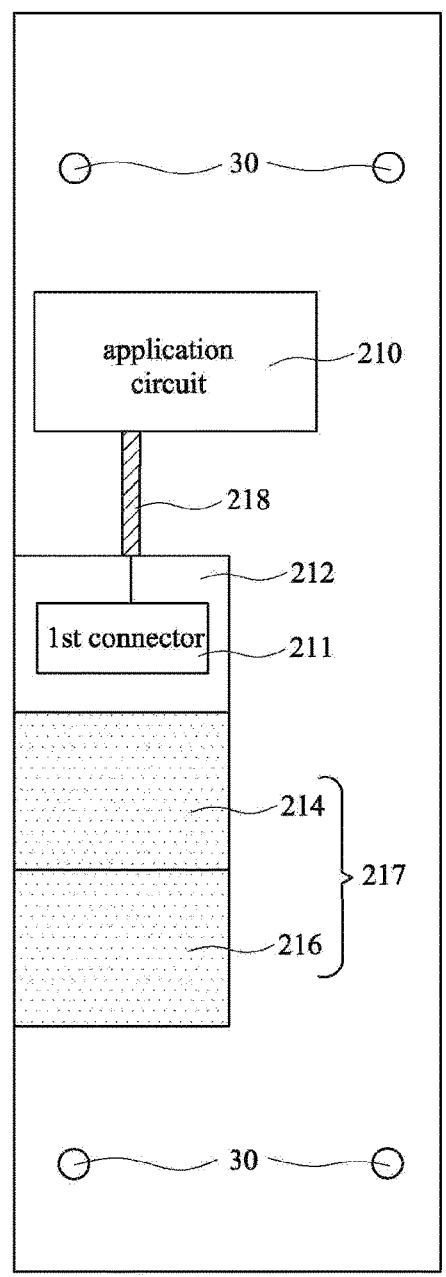
Figure 5:
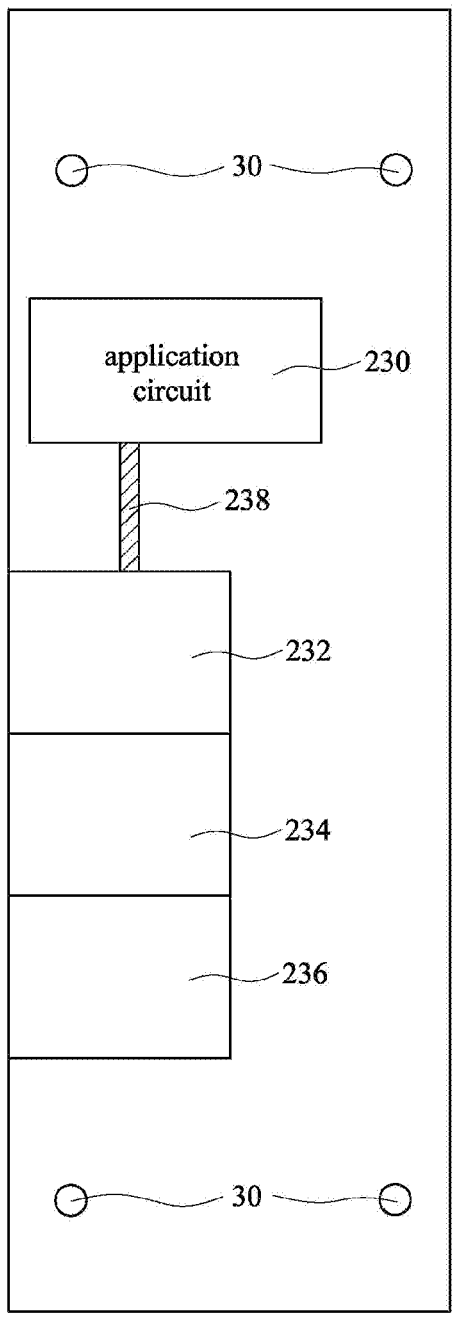
FIG. 5(A) and FIG. 5(B) are planar diagrams of a second slave circuit board before post-production process and after post-production process of the present invention.
Figure 5:
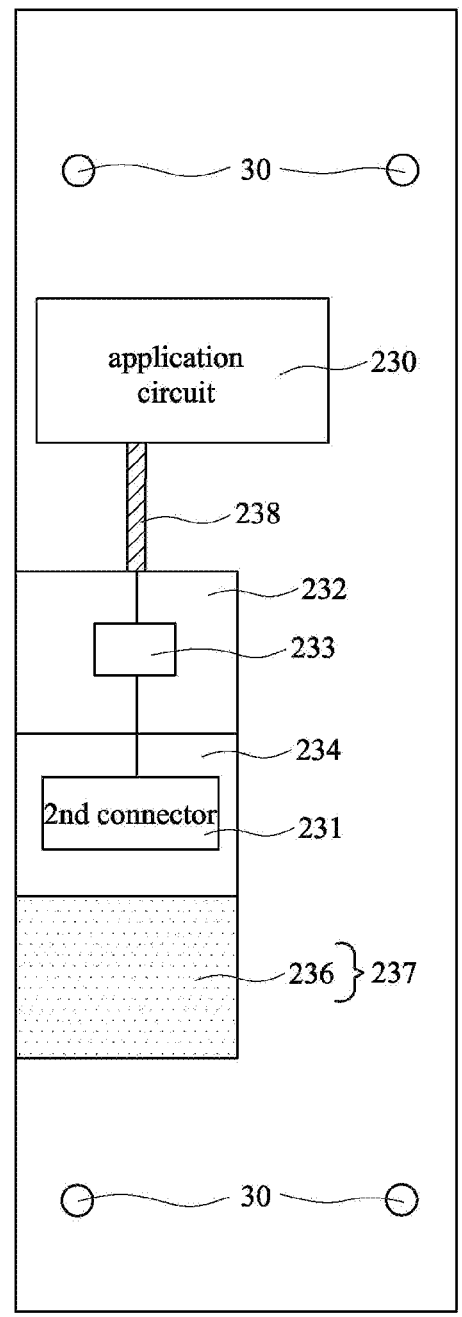
Figure 6:
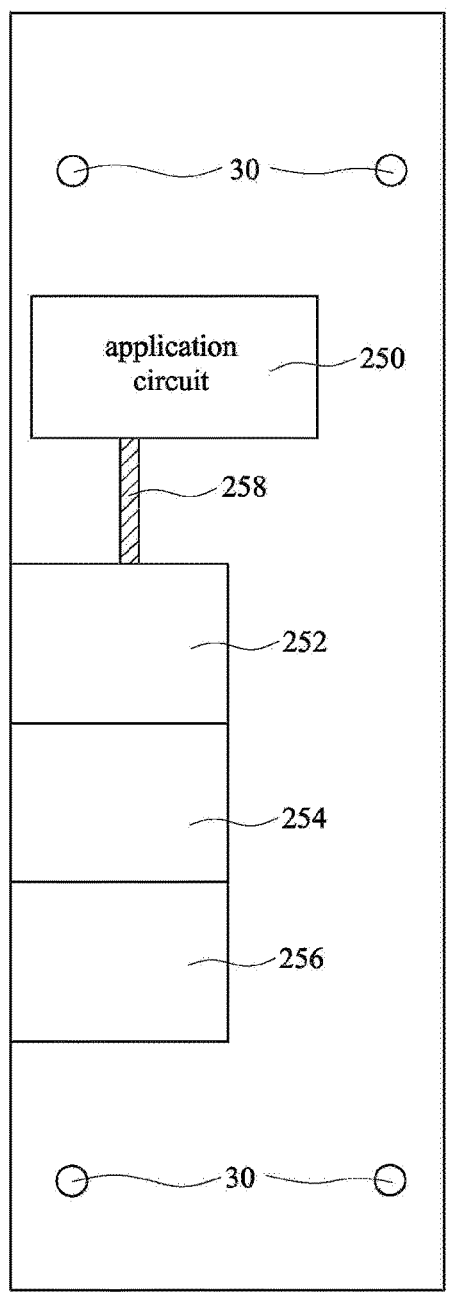
FIG. 6(A) and FIG. 6(B) are planar diagrams of a third slave circuit board before post-production process and after post-production process of the present invention.
Figure 6:
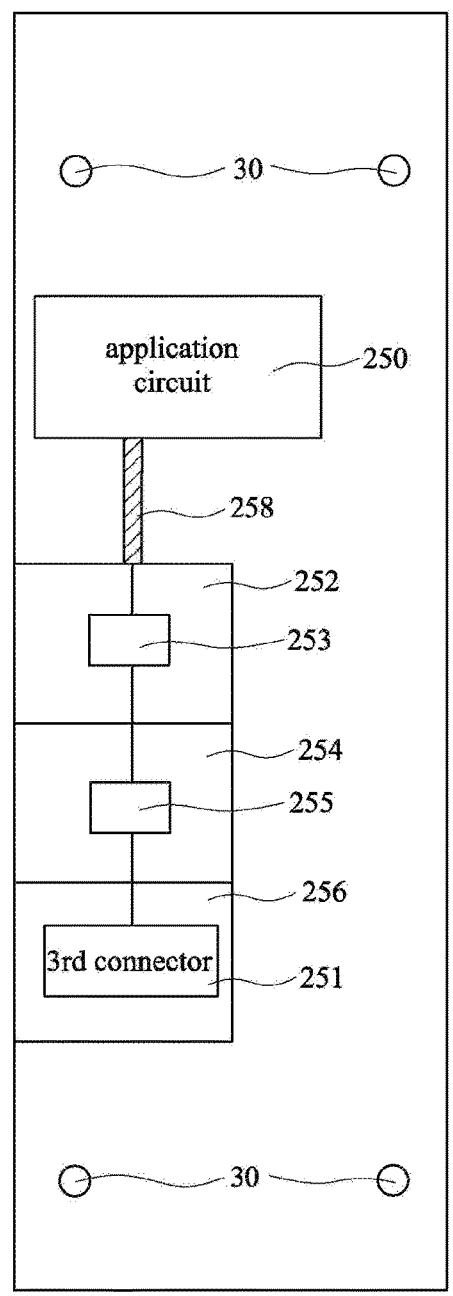

Referring to FIGS. 4(A), 5(A), and 6(A), there are shown planar diagrams of each of slave circuit boards before post-production process of the present invention. As shown in FIG. 4(A), a first slave circuit board 21 comprises an application circuit 210, and defines a plurality of post-production process areas 212, 214, and 216. A circuit layout 218 is arranged between the application circuit 210 and the post-production process areas 212, 214, and 216. As shown in FIG. 5(A), a second slave circuit board 23 comprises an application circuit 230, and defines a plurality of post-production process areas 232, 234, and 236. A circuit layout 238 is arranged between the application circuit 230 and the post-production process areas 232, 234, and 236. As shown in FIG. 6(A), a third slave circuit board 25 comprises an application circuit 250, and defines a plurality of post-production process areas 252, 254, and 256. A circuit layout 258 is arranged between the application circuit 250 and the post-production process areas 252, 254, and 256. In the present invention, the slave circuit boards 21, 23, and 25 are fabricated by adopting the same dimensions and specifications of circuit boards. The slave circuit boards 21, 23, and 25 are expansion cards having different application functions, respectively, such as network card, graphics card, interface specification conversion card, storage expansion card, or expansion card having other application function. Furthermore, the slave circuit boards 21, 23, and 25 before post-production process, their post-production process areas 212, 214, 216, 232, 234, 236, 252, 254, and 256 are without any electrical element, and not arranged with any circuit line.

Figure 7:
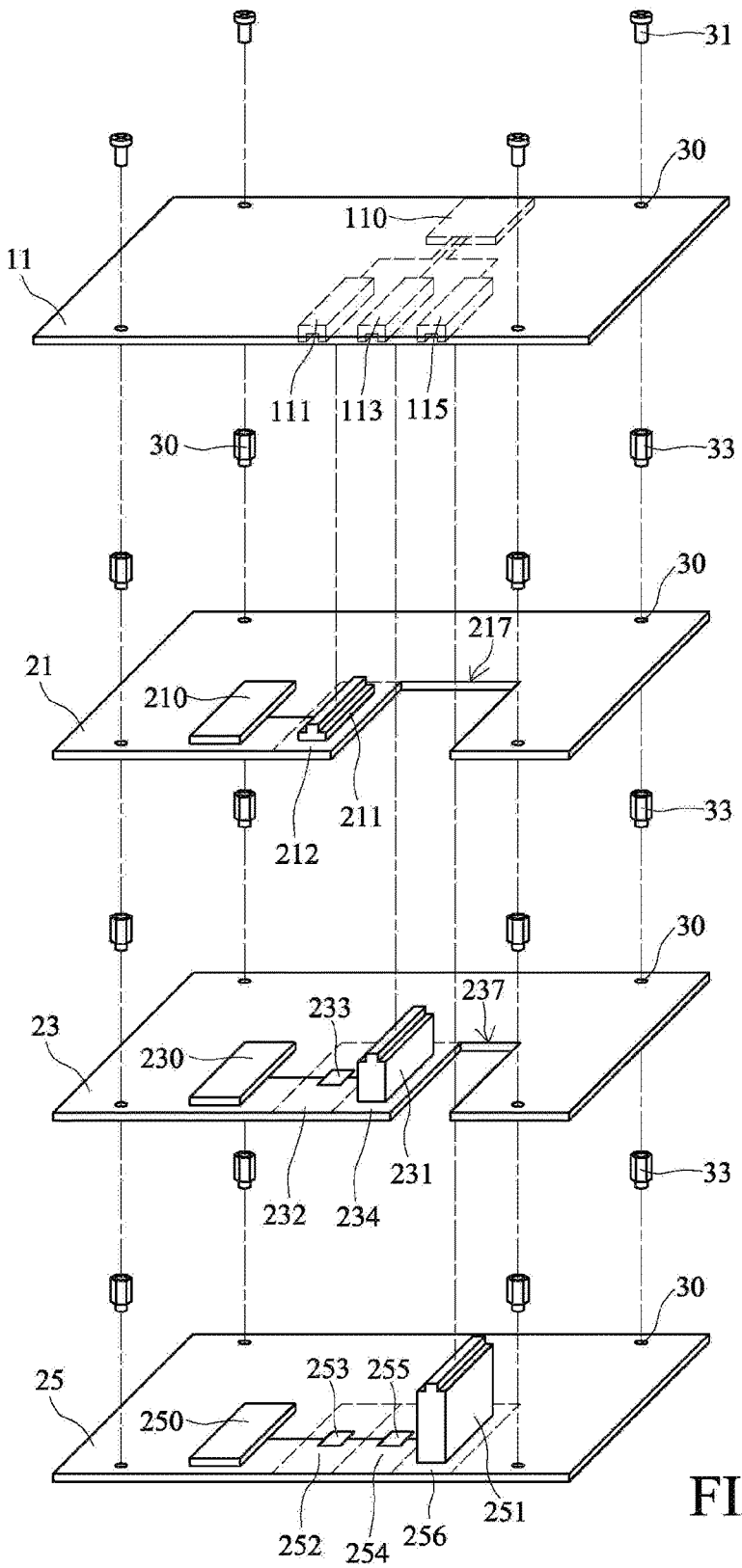
FIG. 7 is an explosion construction diagram of a stacked structure of the present invention.

Continually, referring to FIGS. 4(B), 5(B), and 6(B), there are shown planar diagrams of each of slave circuit boards after post-production process of the present invention, and also referring to FIG. 7, there is an explosion construction diagram of a stacked structure of the present invention.

The slave circuit board 21, 23, or 25 before splicing to the master circuit board 11 must be executed three post-production processes. Firstly, executing a first post-production process, each of slave circuit boards 21, 23, and 25 is disposed with a connector 211, 231, or 251, respectively. Each connector 211, 231, or 251 is disposed on one appropriate post-production process area of the slave circuit board 21, 23, or 25 based on a location of disposition of the corresponding connecting seat 111, 113, or 115, which is able to be inserted by the connector 211, 231, or 251. For example, the first connector 211 of the first slave circuit board 21 is disposed on the post-production process area 212 that is vertical extending to a location of disposition of the first connecting seat 111, which is able to be inserted by the first connector 211; the second connector 231 of the second slave circuit board 23 is disposed on the post-production process area 234 that is vertical extending to a location of disposition of the second connecting seat 113, which is able to be inserted by the second connector 231; the third connector 251 of the third slave circuit board 25 is disposed on the post-production process area 256 that is vertical extending to a location of disposition of the third connecting seat 115, which is able to be inserted by the third connector 251.

Further, when the connectors 211, 231, and 251 prepare to insert into the corresponding connecting seats 111, 113, and 115 of the master circuit board 11, except the first connector 211 of the first slave circuit board 21 being able to be directly inserted into the first connecting seat 111, the second connector 231 of the second slave circuit board 23 must be through the post-production process area 214 of the first slave circuit board 21 in order to insert into the second connecting seat 113, and the third connector 251 of the third slave circuit board 25 must be through the post-production process area 216 of the first slave circuit board 21 and the post-production process area 236 of the second slave circuit board 23 in order to insert into the third connecting seat 115. Therefore, the first slave circuit board 21 and the second slave circuit board 23 will execute a second post-production process for removing the post-production process areas 214, 216, and 236 that impede the connection between the second connector 231 and the second connecting seat 113, and the connection between the third connector 251 and the third connecting seat 115. When the second post-production process executes, the post-production process areas 214, 216, and 236 of the first slave circuit board 21 and the second slave circuit board 23 will be cut by a cutting tool to fabricate into hollow areas 217 and 237. Accordingly, after the post-production process areas 214, 216, and 236 of the first slave circuit board 21 and the second slave circuit board 23 have been cut, the second connector 231 of the second slave circuit board 23 and the third connector 251 of the third slave circuit board 25 can be inserted into the corresponding second connecting seat 113 and the corresponding third connecting seat 115 through the hollow areas 217 and 237 of the first slave circuit board 21 and the second slave circuit board 23.

Sequentially, the first connector 211 of the first slave circuit board 21 is disposed near the circuit layout 218, the pins of the first connector 211 can direct route to the circuit layout 218, and therefore are electrically connected to the application circuit 210 via the circuit layout 218. Comparatively, one post-production process area 232 without being cut, as well as without disposing any electrical element or line is existed between the second connector 231 and the circuit layout 238 of the second slave circuit board 23, resulting in a broken circuit is formed between the second connector 231 and the circuit layout 238. Similarly, two post-production process areas 252 and 254 without being cut, as well as without disposing any electrical element or line are existed between the third connector 251 and the circuit layout 258 of the third slave circuit board 25, resulting in a broken circuit is also formed between the third connector 251 and the circuit layout 258. Therefore, the second slave circuit board 23 and the third slave circuit board 25 will execute a third post-production process in order to make circuit connections capable of constructing between the second connector 231 and the circuit layout 238, as well as between the third connector 251 and the circuit layout 258. When the third post-production process executes, the post-production process area 232 of the second slave circuit board 23 will be disposed with a conductive element 233, and the post-production process areas 252 and 254 of the third slave circuit board 25 will be disposed with conductive elements 253 and 255. Accordingly, after the conductive elements 233, 253, and 255 have been disposed on the post-production process areas 232, 252 and 254, the second connector 231 of the second slave circuit board 23 is able be electrically connected to the circuit layout 238 via the conductive element 233 and further electrically connected to the application circuit 230 via the conductive element 233 and the circuit layout 238, while the third connector 251 of the third slave circuit board 25 is able to be electrically connected to the circuit layout 258 via the conductive elements 253, 255 and further electrically connected to the application circuit 250 via the conductive elements 253, 255 and the circuit layout 258. In one embodiment of the present invention, the conductive elements 233, 252, and 255 are bond pads, metal bumps, or electronic elements (such as impedance elements).

In one preferred embodiment of the present invention, when the first slave circuit board 21 and the second slave circuit board 23 execute the post-production processes, preferentially executing the cutting of the post-production process areas 214, 216 and 236, then executing the disposition of the connectors 211, 231 and/or the conductive element 233, so as to avoid that the connectors 211, 231 and the conductive element 233 are damaged because of the cutting tool in operating. In the present invention, furthermore, the post-production process areas 212, 214, 216, 232, 234, and 236 without any electrical element and circuit line are pre-defined on the first slave circuit board 21 and the second slave circuit board 23, afterward, electrical elements or lines of the application circuits 210 and 230 may avoid to be cut when the cutting process is executed to the post-production process areas 214, 216, and 236 of the first slave circuit board 21 and the second slave circuit board 23, so as to ensure the integrity of the application circuits 210 and 230.

Figure 8:
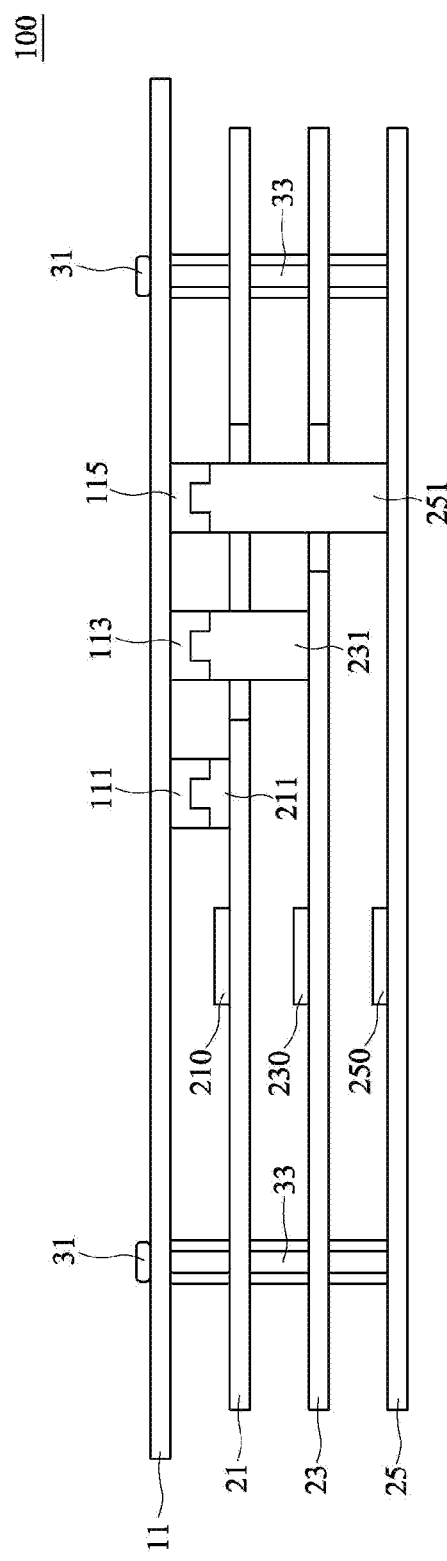
FIG. 8 is a sectional side assembly construction diagram of the stacked structure of the present invention.
Figure 9:
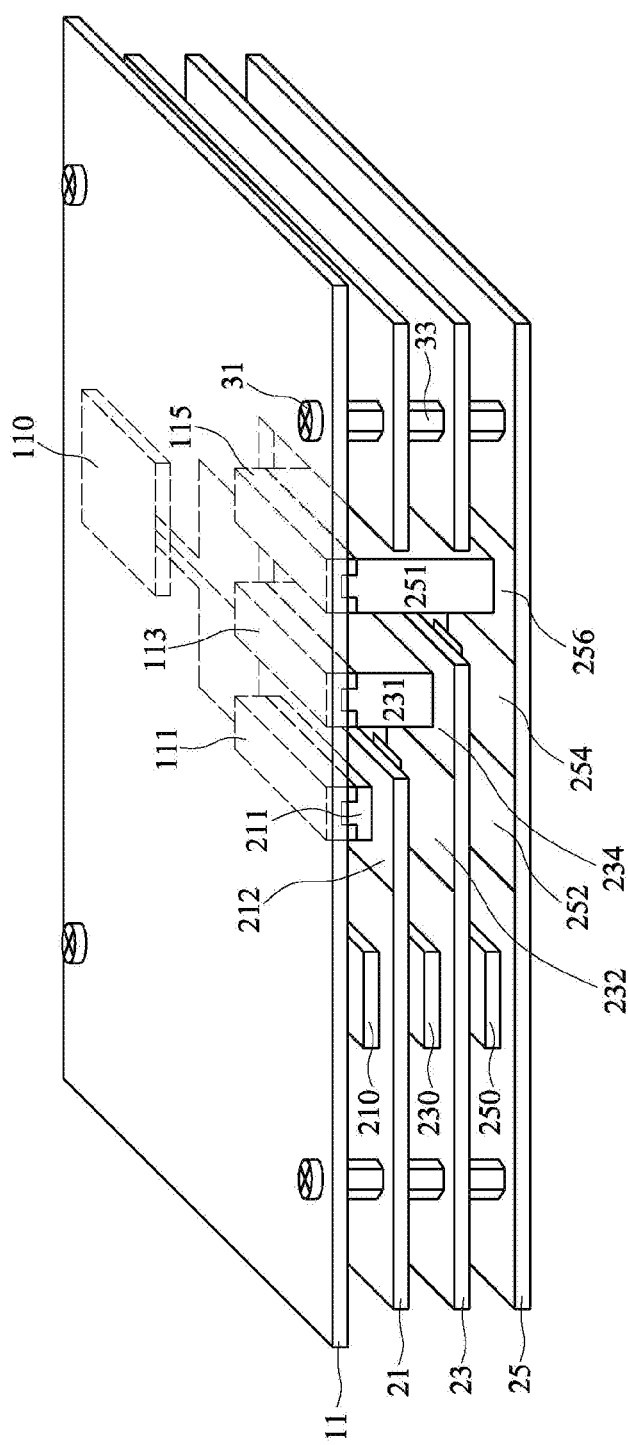
FIG. 9 is a stereoscopic assembly construction diagram of the stacked structure of the present invention.

Referring to FIGS. 8 and 9, there are shown a sectional side assembly construction diagram and a stereoscopic assembly construction diagram of the stacked structure of the present invention, respectively, and also referring to FIG. 7. After completing three post-production processes, the first slave circuit board 21, the second slave circuit board 23, and the third slave circuit board 25 will splice to the master circuit board 11, respectively. The first connector 211 will be inserted into the corresponding first connecting seat 111, the second connector 231 will be inserted into the corresponding second connecting seat 113, and the third connector 251 will be inserted into the corresponding third connecting seat 115.

After completing the slave circuit boards 21, 23, and 25 spliced with the master circuit board 11 together, the processor 110 of the master circuit board 11 will transmit electrical signals to the slave circuit boards 21, 23, and 25 to control the operations of the application circuits 210, 230, and 250 of the slave circuit boards 21, 23, and 25 via the connection between the first connector 211 and the first connecting seat 111, the connection between the second connector 231 and the second connecting seat 113, and the connection between the third connector 251 and the third connecting seat 115. In such a way, the master circuit board 11 is able to expand own functions by these spliced slave circuit boards 21, 23, and 25.

In another embodiment of the present invention, there is further provided with at least one fixed element 31 and at least one fixed column 33, and the bodies of the master circuit board 11 and the slave circuit boards 21, 23, and 25 are provided with at least one hole 30, respectively. When the slave circuit boards 21, 23, and 25 have been spliced with the master circuit board 11 together, the fixed element 31 is combined with the corresponding fixed column 33 through the holes 30 of the master circuit board 11 and the slave circuit boards 21, 23, and 25 so that the slave circuit boards 21, 23, and 25 can be fixed on the master circuit board 11 to increase the stability of the stack structure 100.

In the present invention, the master circuit board 11 is selectively spliced with three slave circuit boards 21, 23, and 25 to construct the stack structure 100; otherwise, in one specific embodiment of the present invention, the master circuit board 11 may also selectively spliced with two, four or more slave circuit boards to construct the stack structure according to the actual requirement of expansion of functions. In one embodiment of the present invention, the number of the connectors of the master circuit board 11 is more than or equal to the number of the slave circuit boards, as well as the number of the post-production process areas defined on each of the slave circuit boards. For example, if the master circuit board 11 is selectively spliced with four slave circuit boards, four or more connectors will be disposed on the master circuit board 11, and four post-production process areas will be defined on each of slave circuit boards.

As the above disclosure, the master circuit board 11 is not only allowed the slave circuit boards 21, 23, and 25 to insert therein by adopting a spliced way, so as to decrease the volume of the stack structure 100, but also the master circuit board 11 is able to simultaneous splice with multiple slave circuit boards 21, 23, and 25 according to the actual requirement of expansion of functions, so as to increase the convenience and flexibility in expansion of functions of the master circuit board.

The above disclosure is only the preferred embodiment of the present invention, and not used for limiting the scope of the present invention. All equivalent variations and modifications on the basis of shapes, structures, features and spirits described in claims of the present invention should be included in the claims of the present invention.

The invention claimed is:

1. A stack structure of circuit board, comprising:
a master circuit board comprising a plurality of connecting seats;
at least two slave circuit boards, each of said slave circuit boards being equipped with a connector, and defined with a plurality of post-production process areas, wherein said stack structure is consisted of said master circuit board and said slave circuit boards, wherein said connector of each of said slave circuit boards is disposed on one of said post-production process areas based on a location of disposition of said corresponding connecting seat of said master circuit board, and inserted into said corresponding connecting seat of said master circuit board, respectively;
wherein when said connector of one of said slave circuit boards must be through the other slave circuit boards in order to insert said corresponding connecting seat of said master circuit board, the post-production process areas that are disposed on the other slave circuit boards and impede a connection between said connector of one of said slave circuit board and said corresponding connecting seat of said master circuit board will be cut to fabricate into hollow areas, so that said connector of one of said slave circuit boards is capable of inserting said corresponding connecting seat of said master circuit board through said hollow areas of the other slave circuit boards.

2. The stack structure according to claim 1, wherein said connector disposed on one of said post-production process areas of each of said slave circuit boards is electrically connected to an application circuit via circuit layouts arranged on said slave circuit board.

3. The stack structure according to claim 2, wherein at least one conductive element is disposed on each of said post-production process areas without being cut, as well as without disposing said connector.

4. The stack structure according to claim 3, wherein said connector of each of said slave circuit boards is electrically connected to said application circuit via said conductive element and said circuit layouts arranged on said slave circuit board.

5. The stack structure according to claim 4, wherein said conductive element is a bond pad, a metal bump, or an electronic element.

6. The stack structure according to claim 1, wherein the number of said connectors of said master circuit board is more than or equal to the number of said slave circuit boards, as well as the number of said post-production process areas defined on each of said slave circuit boards.

7. The stack structure according to claim 1, wherein said slave circuit boards are fabricated by adopting the same dimensions and specifications of circuit boards.

8. The stack structure according to claim 1, further comprising at least one fixed column and at least one fixed element, wherein said master circuit board and said slave circuit boards are further provided with at least one hole, respectively, said fixed member is combined with said corresponding fixed column through said holes of said master circuit board and said slave circuit boards.

* * * * *